United States Patent [19]
Dresselhaus et al.

[11] Patent Number: 6,060,656
[45] Date of Patent: May 9, 2000

[54] SI/SIGE SUPERLATTICE STRUCTURES FOR USE IN THERMOELECTRIC DEVICES

[75] Inventors: Mildred S. Dresselhaus, Arlington; Theodore C. Harman, Lexington; Stephen B. Cronin, Cambridge; Takaaki Koga, Cambridge; Xiangzhong Sun, Cambridge, all of Mass.; Kang L. Wang, Santa Monica, Calif.

[73] Assignee: Regents of the University of California, Oakland, Calif.

[21] Appl. No.: 09/039,719

[22] Filed: Mar. 16, 1998

Related U.S. Application Data

[60] Provisional application No. 60/040,934, Mar. 17, 1997.

[51] Int. Cl.[7] .................................................. H01L 35/30
[52] U.S. Cl. .............................. 136/205; 136/203; 257/15
[58] Field of Search ..................... 136/200, 201, 136/203, 205, 239; 257/15, 18, 19

[56] References Cited

U.S. PATENT DOCUMENTS

| | | | |
|---|---|---|---|
| 2,588,254 | 3/1952 | Lark-Horovitz et al. | 136/89 |
| 2,798,989 | 7/1957 | Welker | 317/237 |
| 3,124,936 | 3/1964 | Melehy | 62/3 |
| 3,259,759 | 7/1966 | Giaever | 307/88.5 |
| 3,296,033 | 1/1967 | Scuro et al. | 136/205 |
| 3,338,753 | 8/1967 | Horsting | 136/237 |
| 3,342,567 | 9/1967 | Dingwall | 29/195 |
| 3,356,464 | 12/1967 | Hulliger | 23/315 |
| 3,626,583 | 12/1971 | Abbott et al. | 29/573 |
| 3,674,568 | 7/1972 | Caprarola | 136/205 |
| 3,873,370 | 3/1975 | Hampl, Jr. et al. | 136/205 |
| 4,029,520 | 6/1977 | Hampl, Jr. et al. | 136/205 |
| 4,261,771 | 4/1981 | Dingle et al. | 148/175 |
| 4,361,814 | 11/1982 | Soclof et al. | 330/4.9 |
| 4,368,416 | 1/1983 | James | 322/2 R |
| 4,457,897 | 7/1984 | Stanley et al. | 423/141 |
| 4,469,977 | 9/1984 | Quinn et al. | 310/334 |

(List continued on next page.)

FOREIGN PATENT DOCUMENTS

| | | |
|---|---|---|
| 0437654 | 7/1991 | European Pat. Off. . |
| 63-020880 | 1/1988 | Japan . |
| 08125237 | 5/1996 | Japan . |
| 1216001 | 12/1970 | United Kingdom . |
| 90/16086 | 12/1990 | WIPO . |

OTHER PUBLICATIONS

Journal of Electronic Materials, vol. 22, No. 9, Aug. 1993, pp. 1165–1172, XP000646076, Harman T.C., "Controlled P–Type Sb Doping in LPE–Grown Hgl–XCDXTE Epilayers." Pp. 1165–1172.

G.D. Mahan, et al., "Thermoelectric Devices Using Semiconductor Quantum Wells" 1994 *J. Appl. Phys.* vol. 76 (3), pp. 1899–1901. No Month Given.

X. Sun, et al., "Quantum Confinement Effects on the Thermoelectric Figure of Merit in Si/Si$_{1-x}$ Ge System" 1997 *Mat. Res. Soc. Symp. Proc.* vol. 478. No Month Given.

L.D. Hicks, et al., "Experimental Study of the Effect of Quantum–Well Structures on the Thermoelectric Figure of Merit" 1996 *Physical Review B*, vol. 53, No. 16. No Month Given.

(List continued on next page.)

*Primary Examiner*—Kathryn Gorgos
*Assistant Examiner*—Thomas H Parsons
*Attorney, Agent, or Firm*—Daly, Crowley & Mofford, LLP

[57] ABSTRACT

A superlattice structure for use in thermoelectric power generation systems includes m layers of a first one of Silicon and Antimony doped Silicon-Germanium alternating with n layers of Silicon-Germanium which provides a superlattice structure having a thermoelectric figure of merit which increases with increasing temperature above the maximum thermoelectric figure of merit achievable for bulk SiGe alloys.

35 Claims, 10 Drawing Sheets

U.S. PATENT DOCUMENTS

| | | | |
|---|---|---|---|
| 4,620,897 | 11/1986 | Nakajima | 156/602 |
| 4,644,753 | 2/1987 | Burke | 62/3 |
| 4,664,960 | 5/1987 | Ovshinsky | 428/98 |
| 4,786,335 | 11/1988 | Knowles et al. | 136/214 |
| 4,847,666 | 7/1989 | Heremans et al. | 357/16 |
| 4,855,810 | 8/1989 | Gelb et al. | 357/87 |
| 4,869,971 | 9/1989 | Nee et al. | 428/635 |
| 4,999,082 | 3/1991 | Kremer et al. | 156/605 |
| 5,006,178 | 4/1991 | Bijvoets | 136/211 |
| 5,021,224 | 6/1991 | Nakajima | 422/248 |
| 5,051,786 | 9/1991 | Nicollian et al. | 357/4 |
| 5,064,476 | 11/1991 | Recine, Sr. | 136/201 |
| 5,156,004 | 10/1992 | Wu et al. | 62/3.1 |
| 5,181,086 | 1/1993 | Yoshida | 257/18 |
| 5,210,428 | 5/1993 | Goosen | 257/17 |
| 5,288,336 | 2/1994 | Strachan et al. | 136/200 |
| 5,415,699 | 5/1995 | Harman | 136/238 |
| 5,436,467 | 7/1995 | Elsner et al. | 257/15 |
| 5,448,109 | 9/1995 | Cauchy | 257/719 |

OTHER PUBLICATIONS

L.D. Hicks, et al., "Thermoelectric Figure of Merit of a One–Dimensional Conductor" 1993 *Physical Review B*, vo. 47, No. 24. No Month Given.

T.C. Harman, et al. "High Thermoelectric Figures of Merit in PbTe Quantum Wells" 1996 *Journal of Electronic Materials*, vol. 25, No. 7. No Month Given.

Farmer, et al., "Sputter Deposition of Multilayer Thermoelectric Films: An Approach to the Fabrication of Two–Dimensional Quantum Wells" 1995, XIII Intl. Conf. on Therm., *American Institute of Physics*. No Month Given.

M. S. Dresselhaus, et al., "Prospects for High Thermoelectric Figures of Merit in 2D System," 1997 *Mat. Res. Soc. Symp. Proc.* vol. 478. No Month Given.

L. D. Hicks, et al., "Use of Quantum–Well Superlattices to Increase the Thermoelectric Figure of Merit: Transport and Optical Studies," 1995 *Mat. Res. Soc. Symp. Proc.* vol. 358. No Month Given.

L. D. Hicks, "Effect of Quantum–Well Structures on the Thermoelectric Figure of Merit," 1993 *Physical Review B* vol. 47, No. 19. No Month Given.

T.E. Whall and E.H.C. Parker, "Preparation of Advanced Materials by Molecular Beam Epitaxy," in *Proc. First Europe Conf. on Thermoelectrics*, D.M. Rowe, ed. (Peter Peregrinus Ltd., London 1987) Chapter 5, pp. 51–63. No Month Given.

Katsuya Oda and Takashi Nakayama, "Effects of Interface Atomic Configurations on Electronic Structures of Semiconductor Superlattices," *Jpn. J. Appl. Phys.* 1992, vol. 31, Part 1, No. 8, pp. 2359–2368. No Month Given.

Kaoru Inoue, et al., "Electron Mobilities in Modulation–Doped $Al_xGa_{i-x}As/GaAs$ and Pseudomorphic $Al_xGa_{i-x}As/In_yGa_{i-y}As$ Quantum–Well Structures," *Physical Review B*, 1993, vol. 47, No. 7, pp. 3771–3778. No Month Given.

Mark L. Biermann, et al., "Wave–Packet Theory of Coherent Carrier Dynamics in a Semiconductor Superlattice," *Physical Review B*, 1993, vol. 47, No. 7, pp. 3718–3717. No Month Given.

L.D. Hicks, et al., "Use of Quantum–well Superlattices to Obtain a High Figure of Merit from Non–Conventional Thermoelectric Materials" 1993 *Appl. Phys. Lett.* vol. 63(23), pp. 3230–3232. No Month Given.

SI/SIGE SUPERLATTICE STRUCTURES FOR USE IN THERMOELECTRIC DEVICES

RELATED APPLICATIONS

This application claims priority under 35 U.S.C. §119(e) from application Ser. No. 60/040,934 filed Mar. 17, 1997.

GOVERNMENT RIGHTS

This invention was made with Government support under Contract No. N00167-92-K-0052 awarded by the Department of the Navy. The Government has certain rights in this invention.

FIELD OF THE INVENTION

This invention relates generally to thermoelectric materials and more particularly to superlattice structures used in thermoelectric materials.

BACKGROUND OF THE INVENTION

As is known in the art, a thermoelectric material refers to a material capable of directly converting thermal energy into electrical energy and vice versa or capable of cooling a material when a current is flowing in the desired direction. Such materials include, for example, semiconductor materials. In a thermoelectric generator, for example, the Seebeck voltage generated under a temperature difference drives a current through a load circuit. Typical thermoelectric generators employ a radioisotope, a nuclear reactor or a hydrocarbon burner as the heat source. Such generators are custom made for space missions, for example. Some materials such as tellurides and selenides are used for power generation up to a temperature of about 600° centigrade (C). Silicon germanium alloys provide better thermoelectric performance above 600° C. and up to about 1000° C. With presently available materials, conversion efficiencies in the five to ten percent range are typically expected.

It would, however, be desirable to provide such thermoelectric materials having higher conversion efficiencies. Such devices may then be effectively employed in apparatus such as automobiles to thus increase the fuel efficiency of the automobile.

Superlattice structures, in general, are known and typically comprise a composite made of alternating ultrathin layers of different materials. Typically, the superlattice has an energy band structure which is different from, but related to, the energy band structure of the component materials. By the appropriate choice of materials (and other factors discussed below), a superlattice having a desired energy band structure and other characteristics can be produced. Superlattices have many uses, including, but not limited to, use in the field of thermoelectric power generation.

The fabrication of a superlattice by molecular beam epitaxy (MBE), or other known epitaxial growth techniques, is generally known. However, the choice of materials and the relative amounts of the materials which make up the superlattice are predominant factors in determining the characteristics of the superlattice. For use as a thermoelectric material in power generation applications, it is desirable to choose the materials, and their relative amounts, so that the thermoelectric figure of merit, ZT, is maximized.

The dimensionless thermoelectric figure of merit (ZT) is a measure of the effectiveness of the material for both cooling and power conversion applications and is related to material properties by the following equation:

$$ZT = S^2 \sigma T/K,$$

where S, $\sigma$, K, and T are the Seebeck coefficient, electrical conductivity, thermal conductivity and temperature, respectively. The Seebeck coefficient (S) is a measure of how readily electrons (or holes) can convert thermal to electrical energy in a temperature gradient as the electrons move across a thermoelement. The highest useful Seebeck coefficients are found in semiconductor materials with a high density of states at the Fermi level. In theory, to maximize the thermoelectric figure of merit ZT, one would try to maximize the Seebeck coefficient S, electrical conductivity $\sigma$ and temperature T and minimize the thermal conductivity K. However, in practice, this is not so simple. For example, as a material is doped to increase its electrical conductivity ($\sigma$), bandfilling tends to lower the Seebeck coefficient S and the electronic contribution, $K_e$, to the thermal conductivity K increases. At a given temperature, the thermoelectric figure of merit ZT for a given material is maximized at an optimum doping level. In most materials, the thermoelectric figure of merit ZT is maximized at doping levels of approximately $10^{19}$ cm$^{-3}$. Since increasing (or decreasing) one parameter may adversely increase (or decrease) another parameter, it is generally difficult to achieve higher values for ZT. Currently, the best thermoelectric materials have a maximum ZT of approximately 1. The ZT values are below one at temperatures both below and above the temperature at which they achieve the maximum value. For example, thermoelectric materials included among the best thermoelectric materials have a ZT of approximately 1 at a temperature of about 300° K. while the value of ZT falls off at temperatures below and above 300° K.

The figure of merit ZT in conventional thermoelectric materials is also related to the thermoelectric materials factor (b*) which may be expressed as:

$$b^* = \mu m^{*3/2}/K_L$$

in which:

$\mu$ is the carrier mobility;

m* is the density of states effective mass; and $K_L$ is the lattice thermal conductivity.

The precise relationship between the thermoelectric materials factor b* and the thermoelectric figure of merit ZT is relatively complex.

A superlattice provides the opportunity to enhance ZT for a number of reasons. Under appropriate conditions, the Seebeck coefficient of a superlattice increases as the thickness of a period of a quasi-two-dimensional superlattice decreases. The carrier mobility is generally increased by means of modulation doping and $\delta$-doping, and this effect has been previously demonstrated in Si/SiGe strained-layer superlattices. Furthermore, the lattice thermal conductivity of a small-period superlattice is expected to be substantially lower than the average of the component materials because of augmented phonon-interface scattering effects.

In view of the above, it would be desirable to provide a superlattice structure which has a thermoelectric figure of merit which increases with increasing temperature above the maximum thermoelectric figure of merit achievable for bulk SiGe alloys.

SUMMARY OF THE INVENTION

The present invention relates to novel superlattice structures which may be used for various purposes including, but without limitation, thermoelectric power generation and electronic devices. For example, a superlattice according to the present invention may be made of alternating layers of a first material and a second material, where the first material comprises silicon (Si) and where the second material comprises SiGe or both materials could be SiGe with different Si to Ge stoichiometric ratios. For example, but without limitation, the superlattice may be made of alternating layers of $Si_{0.95}Ge_{0.05}/Si_{0.7}Ge_{0.3}$ for example. With this particular arrangement, a superlattice structure may be used for various purposes including but not limited to thermoelectric power generation and electronic devices and which has a thermoelectric material having a thermoelectric figure of merit which increases with increasing temperatures above 300° K.

A superlattice comprising alternating layers of $(Si)_m$ and $(SiGe)_n$ (where m and n are the number of Si and SiGe monolayers per superlattice period, respectively) having engineered electronic structures for improved thermoelectric power generation materials (and other uses) may be grown by molecular beam epitaxial growth. In one embodiment, the superlattice comprises m layers of $Si_{0.95}Ge_{0.05}$ and n layers of Sb (or other n-type) doped $Si_{o.7}Ge_{0.3}$ where m and n are preferably between 10 and 100. However, the invention is not so limited. Other combinations and amounts of similar materials may be used. According to a preferred embodiment, molecular beam epitaxy (MBE) may be used to grow $Si_{0.7}Ge_{0.3}$ or Sb doped $Si_{0.7}Ge_{0.3}$ on a Si quantum well which is disposed over a relaxed $Si_{0.7}Ge_{0.3}$ buffer layer which in turn is disposed over a highly insulating substrate.

It has been discovered that the figure of merit ZT for selected quantum well superlattice structures increases with increasing temperature. Materials having a relatively wide band gap are preferred for operation above ambient temperature. It has also been discovered that Silicon quantum wells show enhanced thermoelectric characteristics relative to bulk materials with improved performance at elevated temperatures and relatively high doping concentrations, for example, samples doped in excess of $2 \times 10^{18}$ cm$^{-3}$. Preferred materials include Si and SiGe. In accordance with the present invention, the current flow is in the plane of the quantum well layers.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Figure 1:
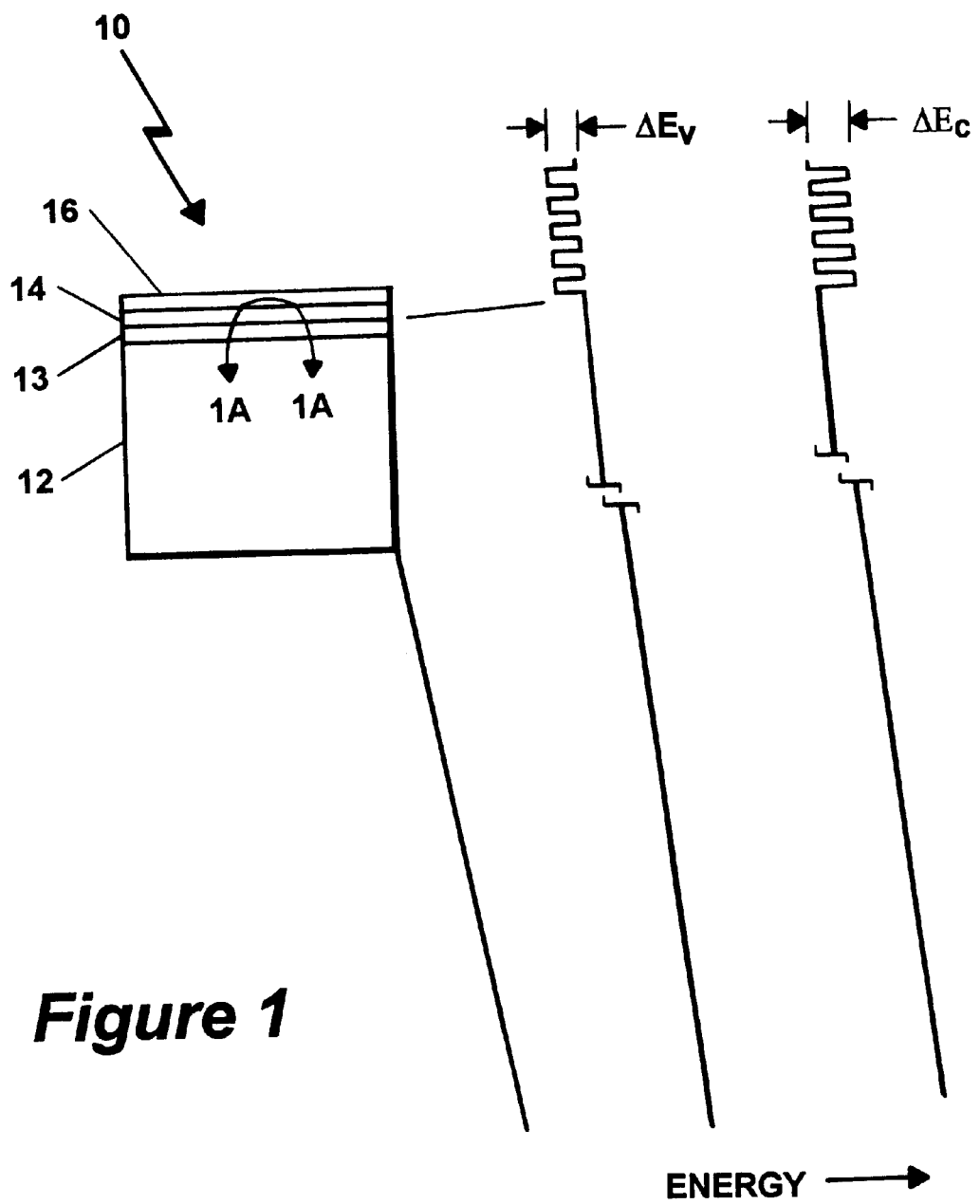
FIG. 1 is a graphical representation of a thermoelectric material and an associated energy band diagram.
Figure 1A:
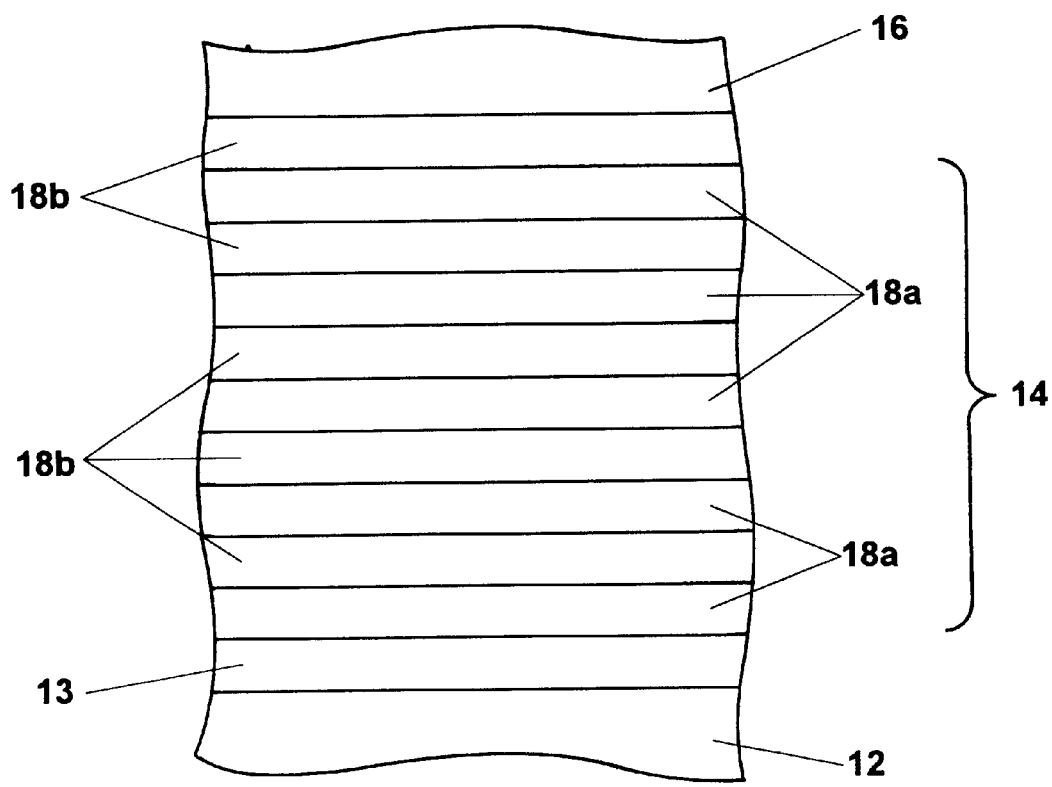
FIG. 1A is a blown up view of a portion of FIG. 1 showing in detail the structure of the superlattice layer.

Referring now to FIGS. 1 and 1A, a thermoelectric device is shown formed on a substrate 12 comprising highly insulating silicon ($Si_2$) or a silicon on insulator (SOI) or other suitable material disposed on a first surface of a buffer layer 13. Disposed over buffer layer 13 is a superlattice structure 14 provided from alternating layers of silicon (Si) and silicon germanium (SiGe). Alternatively, both materials could be SiGe with different Si to Ge stoichiometric ratios. For example, but without limitation, the superlattice may be made of alternating layers of $Si_{0.95}Ge_{0.05}/Si_{0.7}Ge_{0.3}$. The layers of the superlattice structure 14 may be disposed over the buffer layer using conventional deposition techniques on any other suitable techniques.

The highly insulating substrate 12 is provided having a thickness which is as thin as possible, yet which provides lattice matching to the substrate. In the illustrative embodiment, the substrate 12 has a thickness on the order of tens to hundreds of microns ($\mu$m). When measuring characteristics of the superlattice 14, the superlattice remains on the substrate. In applications, the superlattice 14 may be removed from the substrate 12. In the illustrative embodiment, the highly insulating substrate 12 is comprised of silicon. However, it will be appreciated by those of ordinary skill in the art that other highly insulating materials, such as SOI are suitable.

The superlattice 14 may be provided having an overall thickness typically in the range of about 0.5 micron to about 5 microns and may include in the range of about 10–100 periods. It is preferable to provide superlattice 14 having as many periods as possible without compromising the crystal structure and maintaining good carrier mobility. For example, each period is ideally provided having a 20 angstrom quantum well 18a and a 30 angstrom barrier layer 18b for a total period thickness of about 50 angstroms. Thus, a superlattice having 100 periods would be provided having a thickness typically of about 5000 angstroms.

The Si layers of the superlattice 14 are typically doped with a Group V element such as Antimony (Sb) Phosphorous (P) or Arsenic (As) for n-type material. To provide p-type material, the Si is typically doped with a Group III element such a Boron (B) or Gallium (Ga) or Aluminum (Al). A cap 16 is disposed over the superlattice 16.

Figure 4:
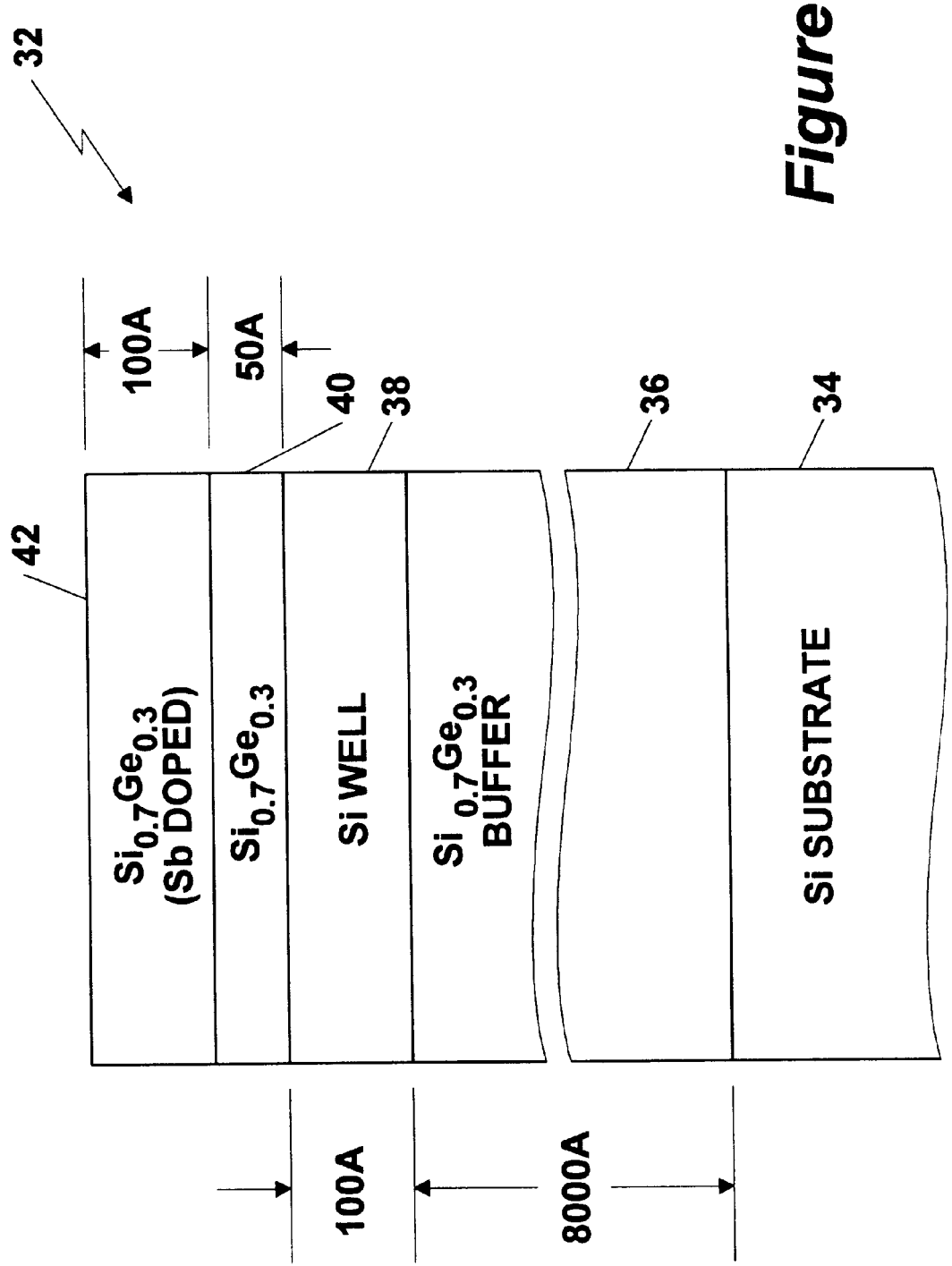
FIG. 4 is a diagrammatical cross-sectional view of a sample material.

As shown in FIG. 4 below, the Si/SiGe layers are disposed over a relaxed SiGe buffer layer 13. Use of a relaxed SiGe buffer layer provides layer band offsets and better quantum confinement. However, it will be appreciated by those of ordinary skill in the art that it may be possible to use other materials to provide the buffer layer 13.

The thickness of each barrier layer 18b is selected to be as small as possible while still providing quantum confinement. For SiGe barriers, the band offsets are relatively small and thus, it may be desirable to introduce one or more relatively thin layers of carbon (C) in each barrier layer 18b to provide a wideband gap semiconductor SiC barrier having a band gap of about three electron volts (3 eV). This approach may reduce the thickness of the barrier layer necessary to achieve quantum confinement. In the illustrative embodiment, SiGe barrier layers 18b have a thickness on the order of tens of angstroms and the SiC barrier layers 18b have a thickness on the order of fractions of angstroms to a few angstroms (referred to as carbon delta-doping) less than the SiGe barrier layers.

The quantum well layers 18a may be provided from either the Si or the SiGe layer, with the barrier layers 18b being provided by the other of the Si and SiGe layers, depending upon the buffer layer 13. If the buffer layer 13 is provided as relaxed $Si_{0.7}Ge_{0.3}$, then the quantum well is Si, whereas if the buffer layer 13 is provided as Si, then the quantum well is SiGe. In practice, Ge in the amount of about 10% could be added to a Si quantum well in order to reduce the thermal conductivity of the quantum well. Each of the quantum well layers 18a is provided having a thickness typically of about 20 angstroms.

Electrons (or holes) would be introduced into the 20 angstrom Si quantum well layer by doping the middle parts of the barrier layer with an n-type (or a p-type) dopant to achieve the optimum carrier concentration in the quantum well. It is often necessary to accept lower doping levels because of solubility limits and loss of mobility. In one embodiment, the barrier layer is doped with Sb to a dopant concentration of $10^{19}$ cm$^{-3}$.

The above superlattice structures may be used for various purposes including but not limited to thermoelectric power generation and electronic devices. Superlattices of the types described herein may be useful in such applications since they are provided having a thermoelectric figure of merit which increases with increasing temperatures above 300° K.

Figure 2:
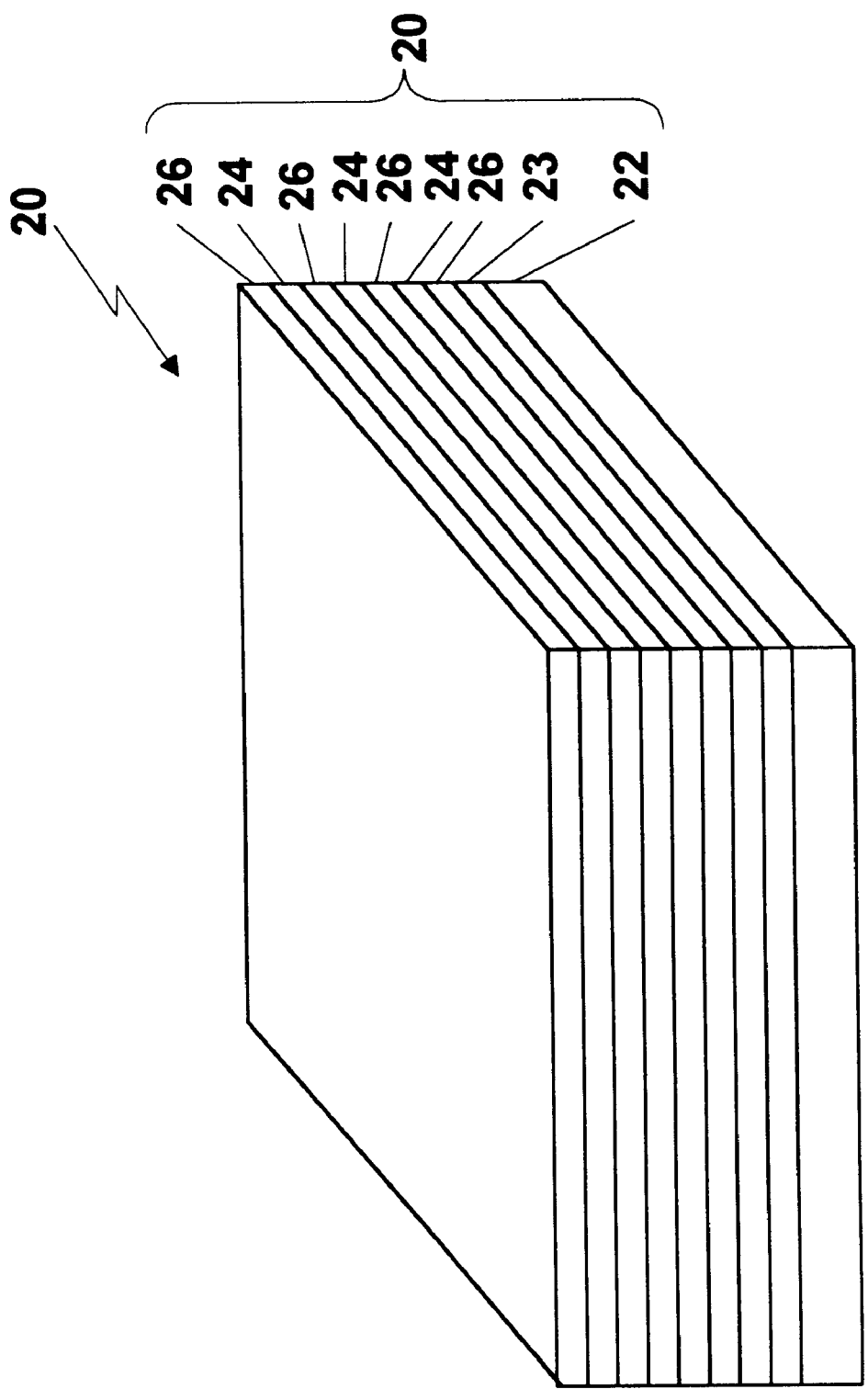
FIG. 2 is a diagrammatical view of a thermoelectric material having a plurality of barrier and quantum well layers.

Referring now to FIG. 2, a Si/SiGe quantum well superlattice 20 is disposed over a SiGe buffer layer 23 which, in turn, is disposed over an insulating Si substrate 22. The superlattice 20 is provided over the buffer layer 23 from a plurality of alternating barrier and quantum wells 24, 26, respectively.

Si/SiGe has the advantage of a larger bandgap than, for example, the conventional thermoelectric material (e.g. $Bi_2Te_3$ or $Bi_{2-x}Sb_xTe_3$) and should perform better thermoelectrically for high temperature operation. The figure of merit, ZT, for a material has a maximum at a temperature where it performs best thermoelectrically. This maximum occurs at a high temperature of about 1000° C. for bulk Si/SiGe.

Figure 3:
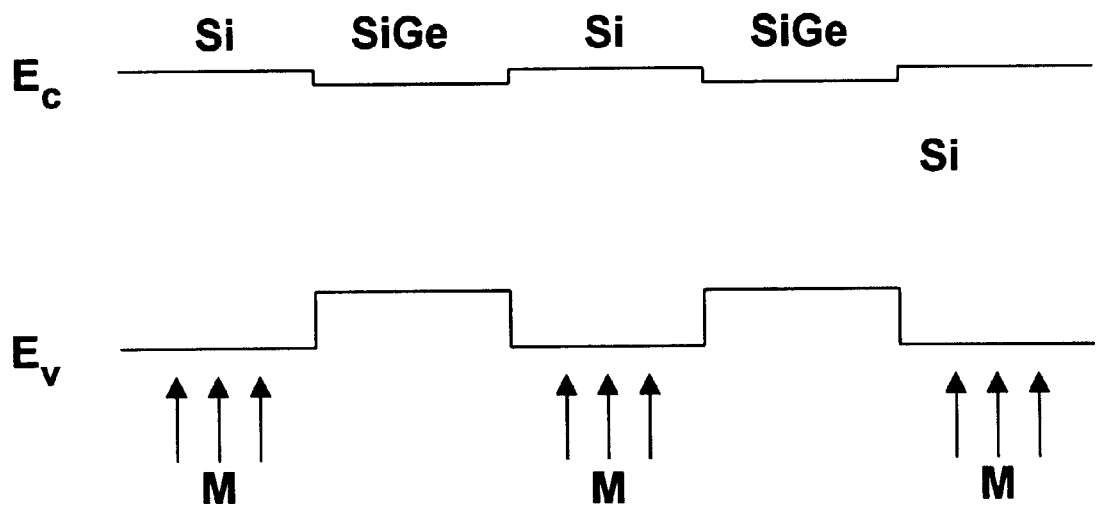
FIG. 3 is a schematic energy band diagram of an $Si_{1-x}Ge_xSi$ superlattice grown on a $Si_{1-y}Ge_y$ buffer layer.
Figure 3A:
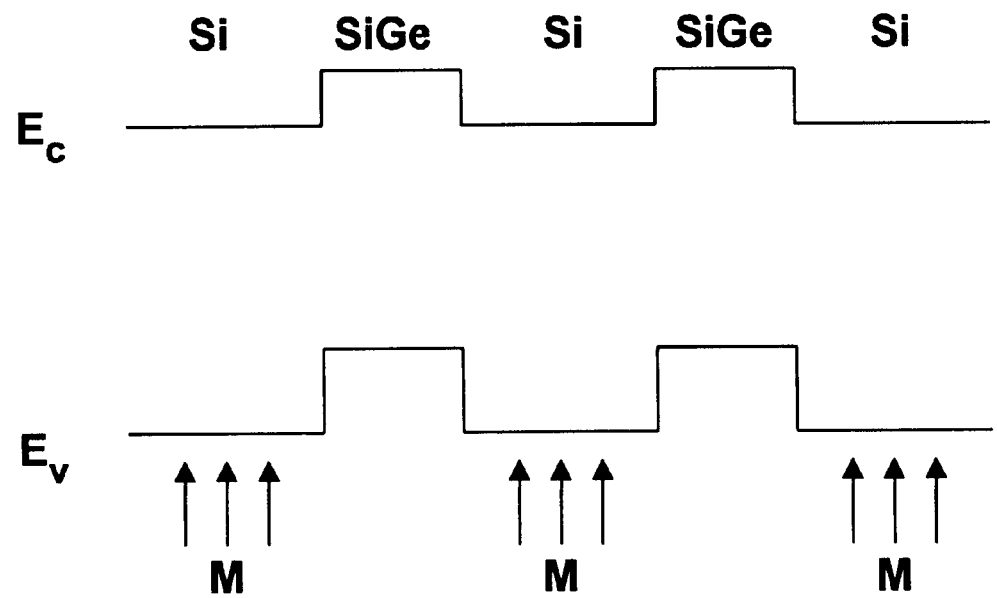
FIG. 3A is a schematic energy band diagram of a type II $Si_{1-x}Ge_x/Si$ superlattice grown on a relaxed $Si_{1-x}Ge_x$ buffer layer.

Referring now to FIGS. 3, 3A, for the case of a Si/SiGe superlattice, a type I superlattice as in FIG. 3 can be made when the material is grown on a Si substrate (smaller lattice constant than SiGe) and in this case the n-type quantum well is provided by the SiGe layer. The problem with this configuration is the small band offset in the conduction band. Therefore, it is preferred to use a relaxed $Si_{1-x}Ge_x$ buffer layer which yields a type II superlattice (FIG. 3A) where the n-type quantum well is provided by the Si layer and the p-type quantum well would be provided by the SiGe material. Doping (either n-type or p-type) would be introduced in the barrier regions to keep the mobility in the quantum well as high as possible.

Even with the relaxed SiGe substrate, the band offset of Si in the conduction band is very small (only about 100 meV) compared to 140–170 meV for a PbTe/PbEuTe superlattice. It may therefore, be advantageous to utilize large SiGe barrier widths and the use of carbon doping in the barrier layer to make some thin SiC regions (e.g. regions having a width on the order of about 10 Angstroms) to effectively increase the barrier height in the SiGe so that the barrier width could be reduced. Thus in accordance with a further aspect of the present invention, carbon is introduced into the middle of the barrier region as an isoelectronic dopant.

Figure 3B:
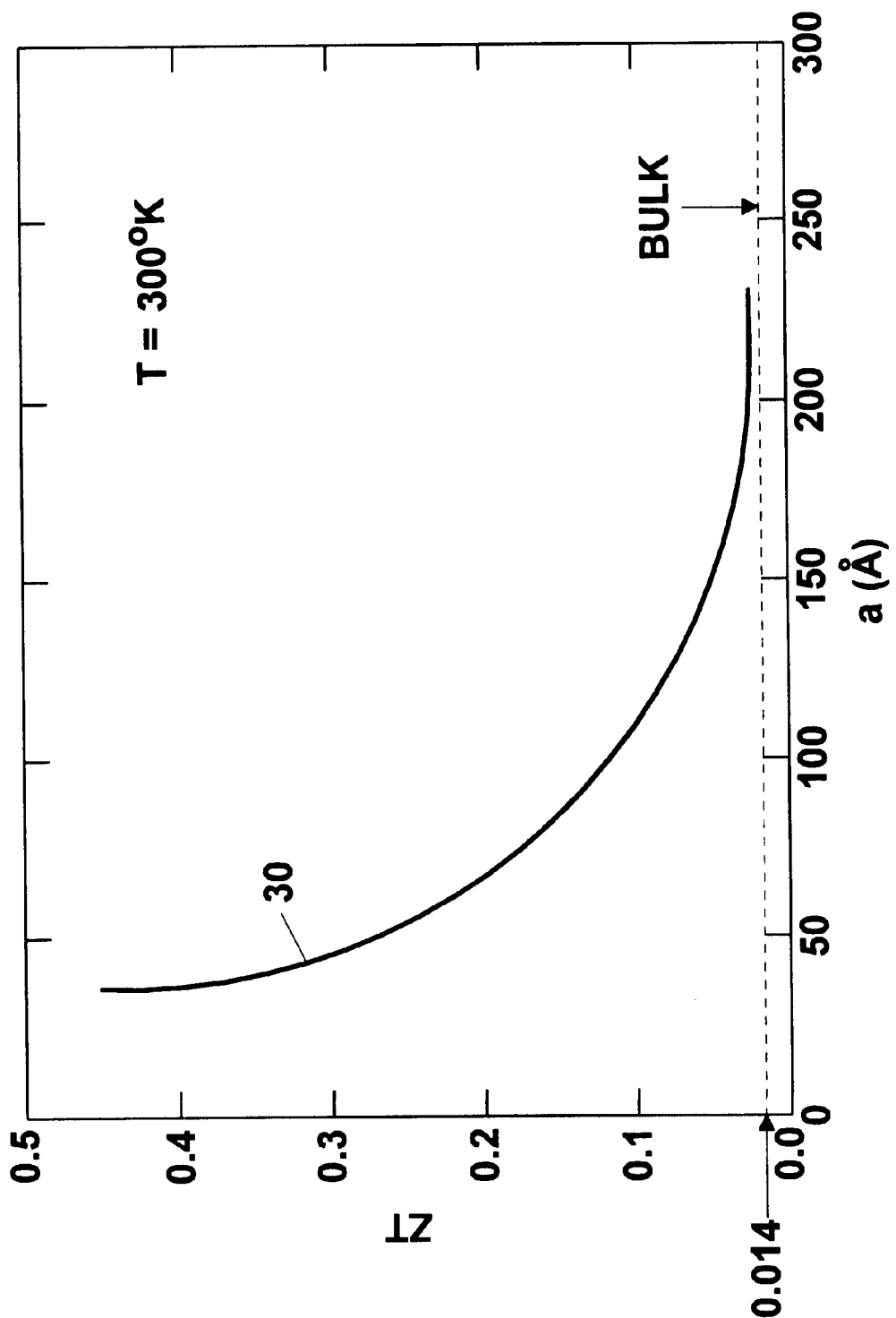
FIG. 3B is a plot of the calculated $Z_{2D}T$ vs. quantum well width for a Si quantum well at optimal doping level.

Referring now to FIG. 3B, ZT versus quantum well thicknesses is shown based on calculation of S, σ and $K_e$ (based on the Boltzmann equation, using literature values for the constant energy surface effective masses and their anisotropy). The curve 30 shows ZT for doped silicon and the dotted horizontal line shows ZT for bulk silicon. The quantum well in FIG. 3B is in the Si layer. Doping is at an optimum level to maximize the power factor. FIG. 3B reveals that ZT is enhanced for small quantum well thicknesses. For the specific parameters of the doped Si, enhancement of ZT in the quantum well is evident by ~70–100 angstroms and can be large at 20 angstroms. The calculated bulk value of ZT at room temperature (0.014) is very low.

Figure 6:
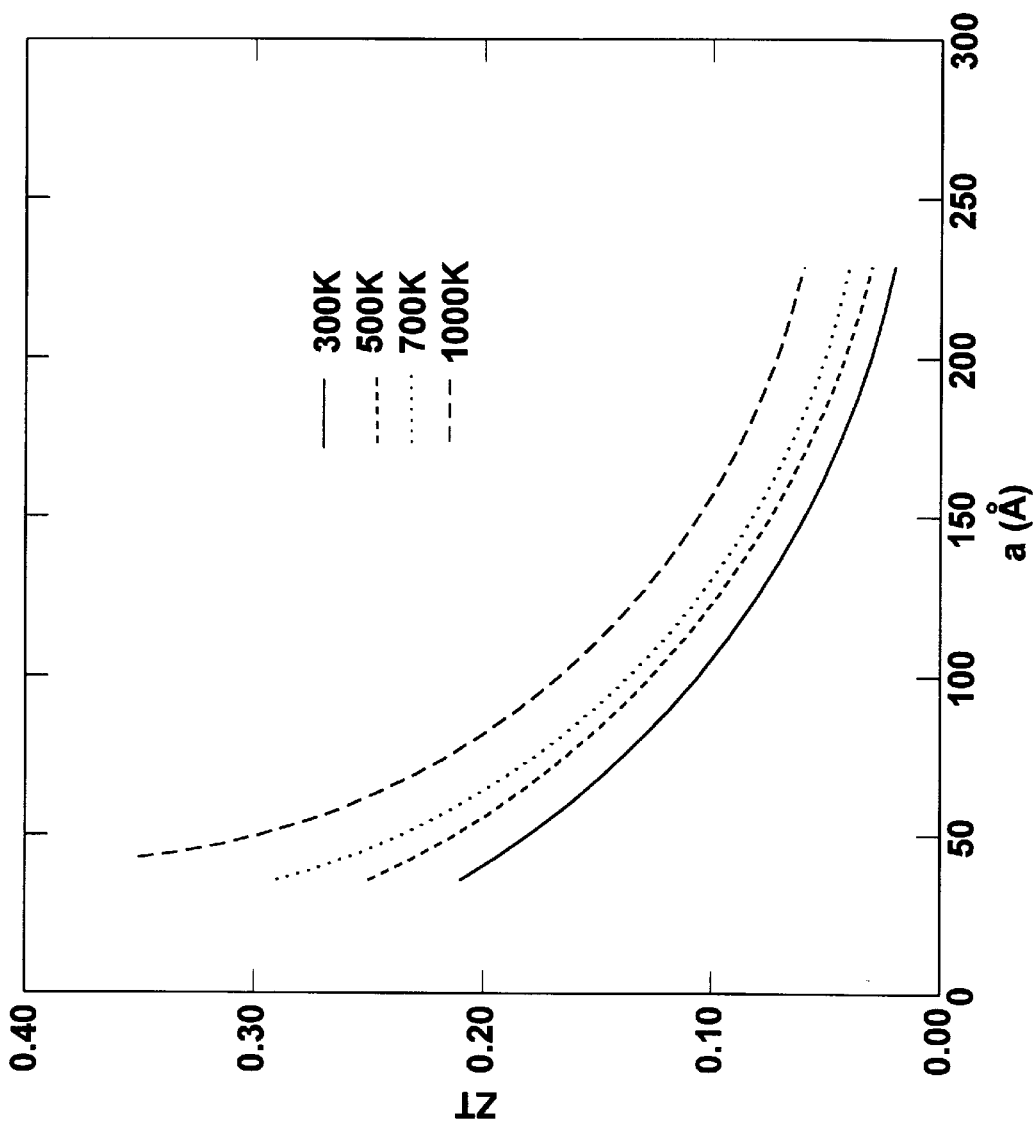
FIG. 6 is a plot of $Z_{2D}T$ vs. quantum well width for a Si quantum well which has been heavily doped and which has a mobility which falls off more slowly with temperature than the quantum well shown in FIG. 6A.
Figure 6A:
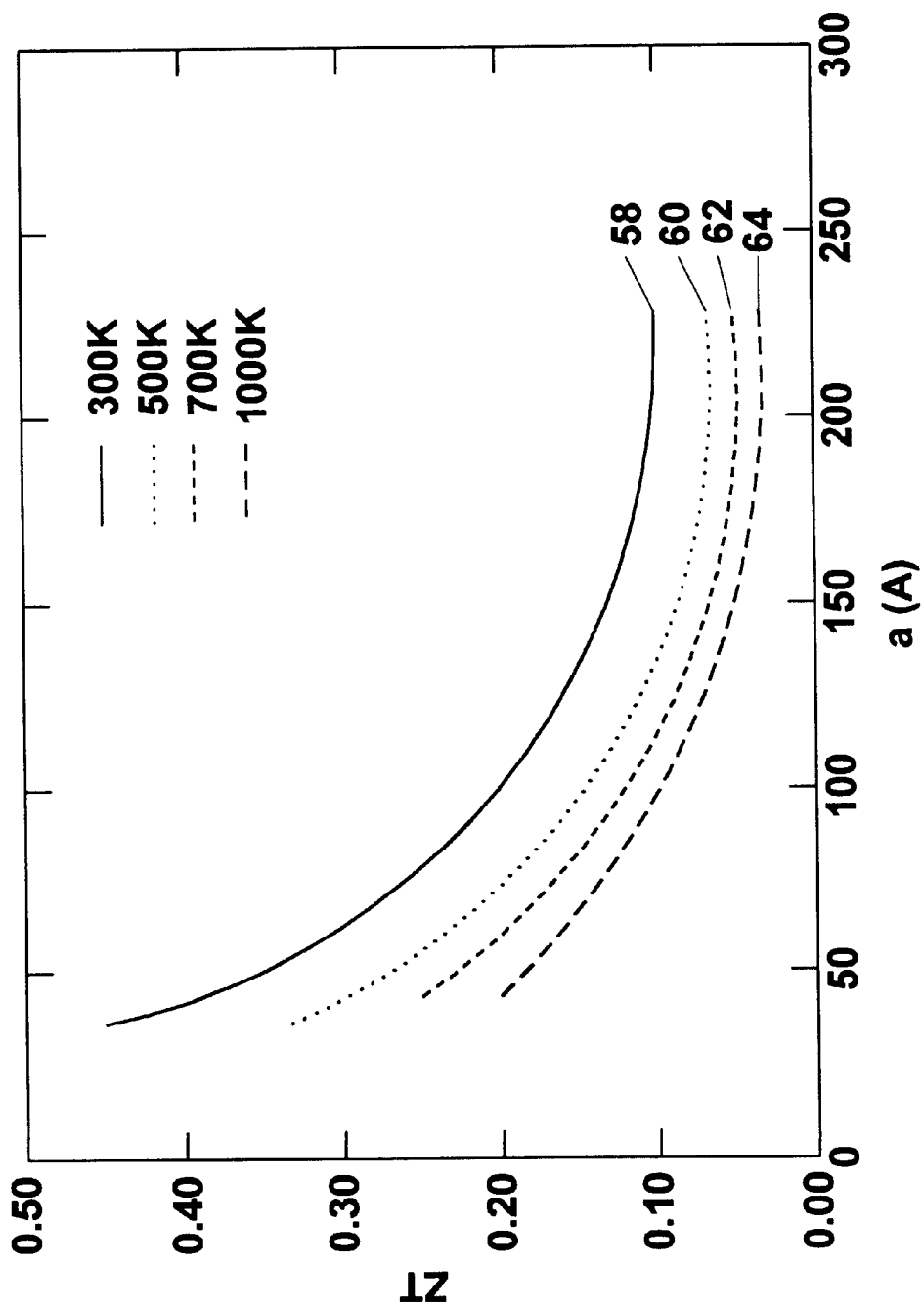
FIG. 6A is a plot of $Z_{2D}T$ vs. quantum well width for a Si quantum well which has a mobility with a temperature dependence that is characteristic of intrinsic Si.

FIGS. 6 and 6A illustrate larger values of ZT for Si at higher temperatures, which is implied by measurements on 3D SiGe (and also Si). It will be appreciated, of course, that in practice when producing a quantum well with Si for applications, it would be doped with perhaps 10% Ge to reduce the thermal conductivity. Since ZT in Si and SiGe increases with increasing temperatures, quite high values of ZT for Si (and SiGe) quantum wells could be expected at high temperature operation (perhaps up to 1000° K.).

Referring now to FIG. 4, a sample 32 includes a substrate 34 provided from low insulating Si or SOI, which could be removed for use of the structure thereover in a device. The sample is grown on a buffer layer 36 which has 30% Ge/70% Si and is 8000 angstroms thick. The larger size of the Ge atom results in a strained Si quantum well (100 angstroms) 38 with a small band offset to the $Si_{0.7}Ge_{0.3}$ barrier layer 40. Testing revealed that a heavily doped sample ($4\times10^{18}$/cm$^3$ n-type carrier concentration at 300° K.) can maintain good mobility and it does. In this test sample, the doping (with Sb dopant—n-type) was introduced into the cap layer 42 which is 100 angstroms thick. As arranged, the electrical conductivity is mainly in the Si quantum well and the mobility was reduced by only ~50% relative to intrinsic Si. Measurement of the Seebeck coefficient within the quantum well is complicated because the contributions from each of the constituents must be sorted out to get the contribution from the Si quantum well itself.

Figure 5:
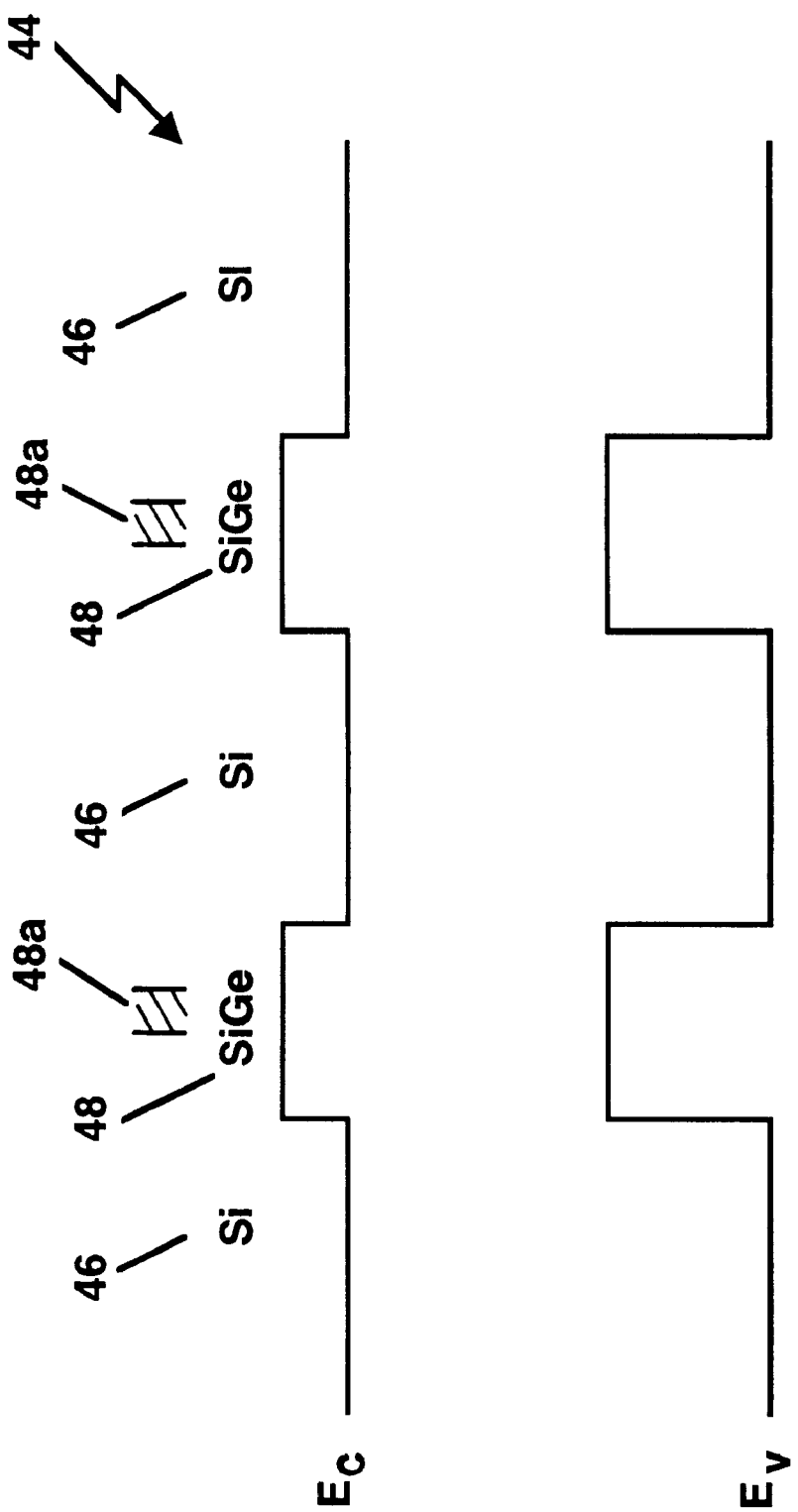
FIG. 5 is a plot of the energy bands for a Si/SiGe structure.

Referring now to FIG. 5, a schematic energy band diagram of a quantum well superlattice grown on relaxed $Si_{1-x}Ge_x$ (e.g., $Si_{0.7}Ge_{0.3}$) is shown. The superlattice 44 is similar to that discussed above in conjunction with FIG. 3A.

The percentage Ge in $Si_{1-x}Ge_x$ is chosen so that the valence band in FIG. 5 has an appropriate band offset. Because of the larger band offset, for the valence band, it is possible to use narrower barrier layers 46 for p-type samples (quantum well 48 would be in the SiGe). Therefore, the delta-doping with carbon discussed above would be more important for n-type Si than for p-type Si.

Regarding the doping with Sb (as in FIG. 5) in order to provide electron carriers to the quantum well, there are two ways to do the doping. For the single quantum well sample shown in FIG. 4 Sb doping is used in the cap layer 42. However, in making n-type Si quantum wells in a superlattice, the Sb dopant is introduced in the middle region of the barriers using the technique typically referred to in the semi-conductor literature as modulation doping. The reason for not doping the barrier regions all the way to the interfaces with the quantum wells is to try to reduce carrier scattering at the interface, thereby keeping the mobility high within the quantum well.

Hall characterization of the superlattice of FIG. 5 is as follows:

| Temperature (K.) | 77 | 300 |
|---|---|---|
| Mobility ($cm^2V^{-1}s^{-1}$) | 4000 | 700 |
| Carrier density ($cm^{-3}$) | $2 \times 10^{18}$ | $4 \times 10^{18}$ |

Referring now to FIG. 6, a plot of the calculated $Z_{2D}T$ versus quantum well width denoted by "a" is shown. This figure shows that at a carrier concentration of $10^{17}$ $cm^{-3}$ the weaker temperature dependence of the mobility (as compared with intrinsic Si (FIG. 6A)) indicates that the higher ZT values found in bulk Si/SiGe should also apply in the 2D quantum wells. Thus Si/SiGe should be a good thermoelectric at high temperature for quantum wells and the enhancement due to quantum confinement (as shown by the increase in ZT as the quantum well width decreases) should apply equally well at high temperatures. Data at higher carrier concentrations (more like the samples described herein) indicate a mobility with an approximate 1/T temperature dependence, likely due to a large amount of carrier scattering.

FIG. 6A shows a series of curves 58, 60, 62, 64 of calculated $Z_{2D}T$ as a function of quantum well width for the same values of temperature as FIG. 6 using the temperature dependence of the mobility $\mu \sim T^{5/2}$ due to phonons. If FIG. 6A were applicable, then Si/SiGe would not make a good thermoelectric material at high temperature. This is because the gain in ZT from using a quantum well would in part be lost by the unfavorable temperature dependence. It should be noted that the mobility falls off more slowly with temperature for the material system shown in FIG. 6 as compared with the material system shown in FIG. 6A.

Figure 7:
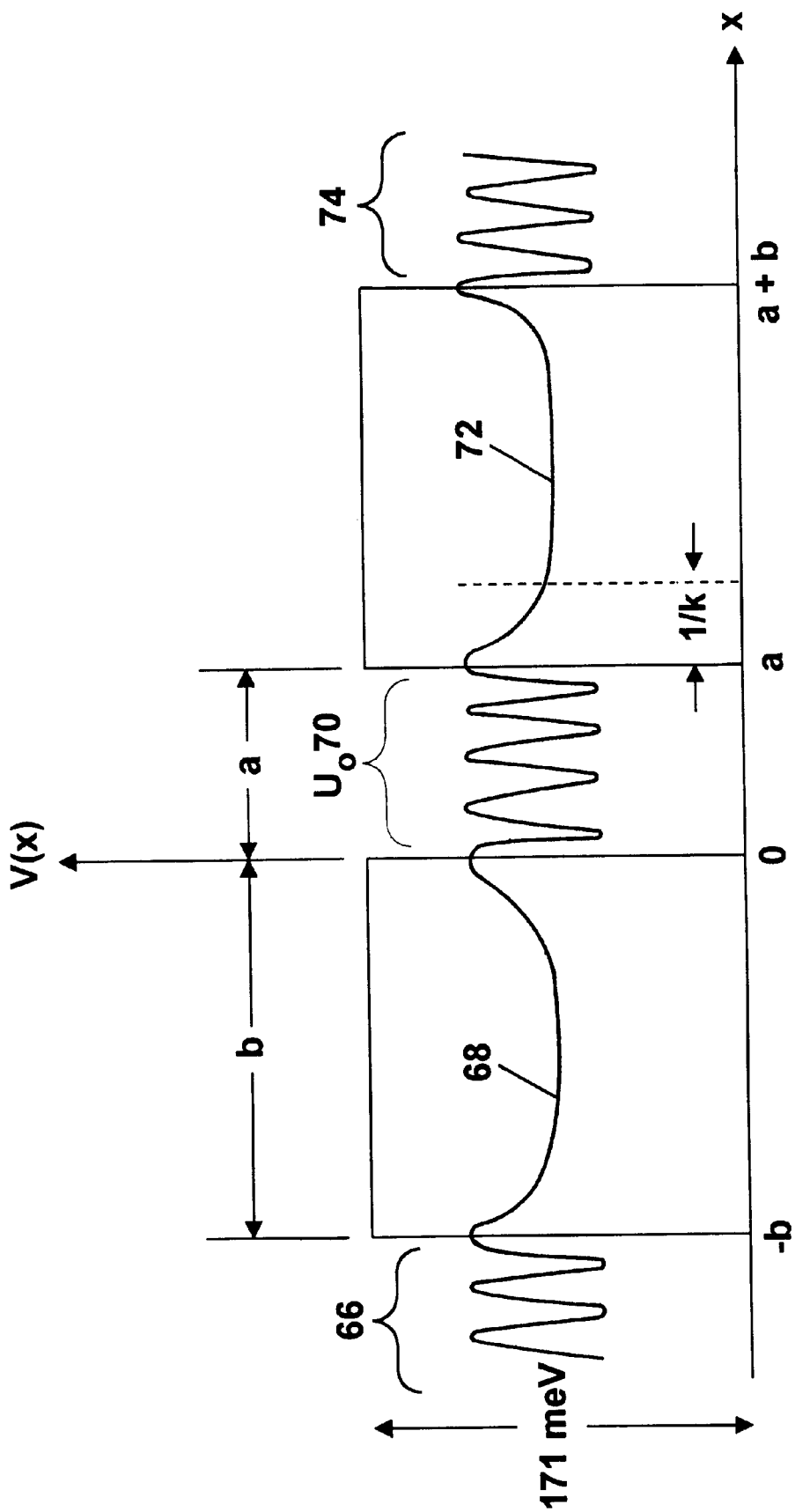
FIG. 7 is a diagrammatical plot of the electron wave function in quantum well structures for a particular example of a Si/SiGe superlattice.

Referring now to FIG. 7, a diagrammatical view of quantum wells (66, 70, 74) and barriers (68, 72) illustrates the result of calculations regarding quantum confinement. Consideration of FIG. 7 reveals that the electron wave function is mainly confined to the quantum wells 66, 70, 74 with only a little bit of wave function penetrating into the barrier region (width b). The model is based on calculations of the wave function leakage into the barrier and the transmission of the wave function intensity from one quantum well to the next quantum well. These calculations help to design the quantum well structure to maximize the wave function within the quantum well. For example, using this model, it has been discovered in accordance with the present invention, that the improvement in quantum confinement is achieved by introducing δ-doping with the isoelectronic dopant carbon in the barrier region, assuming the formation of SiC (with a bandgap of 3 eV in the δ-doping layer).

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A thermoelectric device comprising:
    a buffer layer having a first and second opposing surfaces;
    a superlattice layer having a first surface disposed over the second surface of said buffer layer, said superlattice layer comprising alternating layers of silicon and silicon germanium wherein first ones of the alternating layers are doped with a dopant concentration in the range of $4 \times 10^{18}$ $cm^{-3}$ to $1 \times 10^{18}$ $cm^{-3}$ such that said superlattice layer has a thermoelectric figure of merit which increases with increasing temperature above a temperature of 300° K.

2. The thermoelectric device of claim 1 wherein said superlattice includes 10 or more periods.

3. The thermoelectric device of claim 2 wherein each period is provided having a quantum well layer thickness of about 20 angstroms and a barrier layer thickness of about 30 angstroms.

4. The thermoelectric device of claim 3 wherein said silicon layer is doped with a dopant comprising a Group V element.

5. The thermoelectric device of claim 4 wherein said dopant comprises a first one of antimony (Sb) and arsenic (As).

6. The thermoelectric device of claim 3 wherein said silicon layer is doped with a dopant comprising a Group III element.

7. The thermoelectric device of claim 6 wherein said dopant comprises a first one of boron and gallium.

8. The thermoelectric device of claim 3 wherein:
    said quantum well layer is provided having a thickness typically of about 20 angstroms; and
    said barrier layer is provided as Si and a middle portion of said barrier layer is doped with a p-type dopant to introduce holes into said quantum well layer to provide said quantum well layer having a predetermined carrier concentration.

9. The thermoelectric device of claim 2 wherein said buffer layer comprises a silicon germanium (SiGe) buffer layer to provide a band offset in a conduction band of said superlattice layer.

10. The thermoelectric device of claim 9 wherein said superlattice is provided having a thickness typically in the range of about 0.5 microns to about 5 microns.

11. The thermoelectric device of claim 10 wherein said silicon germanium layer corresponds to a barrier layer and said device further comprises at least one layer which includes carbon to provide a silicon carbon layer having a predetermined band gap.

12. The thermoelectric device of claim 10 wherein said silicon layer corresponds to a quantum well layer.

13. The thermoelectric device of claim 12 wherein said quantum well layer is provided having a thickness not less than about 20 angstroms.

14. The thermoelectric device of claim 13 wherein said buffer layer is provided as $Si_{0.7}Ge_{0.3}$.

15. The thermoelectric device of claim 14 wherein said quantum well layer comprises germanium to reduce the thermal conductivity characteristic of said quantum well layer.

16. The thermoelectric device of claim 15 wherein:
    said quantum well layer is provided having a thickness typically of about 20 angstroms; and
    a portion of said barrier layer is doped with an n-type dopant to introduce electrons into said silicon quantum well layer to provide said quantum well layer having a predetermined carrier concentration.

17. The thermoelectric device of claim 14 further comprising a substrate having first and second opposing surfaces with the first surface of said buffer layer disposed over the first surface of said substrate, said substrate provided from silicon having a very high insulating characteristic and having a thickness selected to provide mechanical support to said buffer layer.

18. A thermoelectric device for thermoelectric power generation, said thermoelectric device comprising:

an insulating silicon substrate;

a silicon germanium buffer layer disposed over said insulating silicon substrate;

a quantum well superlattice disposed over said silicon germanium buffer layer, said superlattice provided from a plurality of alternating barrier and quantum well layers wherein each of said plurality of barrier layers are provided from silicon germanium and each of said plurality of quantum well layers are provided from silicon doped with an n-type dopant and wherein the thickness of said barrier and quantum well layers and the dopant concentration of said quantum well layers are selected such that said superlattice is provided having a thermoelectric figure of merit which increases with increasing temperature above a temperature range of greater than 300° K to about 1000° K.

19. The thermoelectric device of claim 18 wherein said quantum well layer is provided having a dopant concentration and said barrier and quantum well layers are each provided having a thickness which provide said superlattice having an optimum thermoelectric figure of merit at a temperature of about 1000° K.

20. The thermoelectric device of claim 19 wherein the quantum well is provided as an n-type quantum well.

21. The thermoelectric device of claim 20 wherein an n-type dopant is introduced into said barrier layer.

22. The thermoelectric device of claim 21 wherein each of said barrier layers is provided having a first relatively narrow width while still providing quantum confinement and a carbon dopant is introduced into at least one barrier layer to provide a region of silicon carbon having a width which is thin relative to the width of the SiGe barrier layer.

23. The thermoelectric device of claim 22 wherein the carbon dopant is introduced into each of said barrier layers.

24. The thermoelectric device of claim 22 wherein the width of said silicon carbide region is selected to increase the effective barrier height of said SiGe barrier layer such that a barrier layer having a width which is less than the first relatively large width provides a barrier height which is substantially the same as the barrier height provided by said SiGe barrier layer having the first relatively large width.

25. The thermoelectric device of claim 21 further comprising carbon introduced into the middle of the barrier region as an isoelectronic dopant.

26. A superlattice structure for thermoelectric power generation comprising a plurality of alternating layers of a first material and a second material wherein the first material comprises $D_zJ_{1-z}$ and the second material comprising Si; and wherein:

D is a Group IV non-metal selected from the group consisting of Ge, Si and C;

J is a group IV non-metal selected from the group consisting of Ge, Si and C;

D is not the same as J; and $0 \leq Z \leq 1$.

27. The superlattice of claim 26 having thermoelectric figure of merit greater than approximately 1.7 at 300° K. with a Si quantum well width of approximately 25 Å.

28. The superlattice of claim 26 wherein said Si layer has a carrier concentration of about $4 \times 10^{18}$ cm$^{-3}$.

29. The superlattice as recited in claim 27 wherein the first material is provided as silicon germanium having a compositional ratio silicon to germanium in the range of 0.3 to 0.7.

30. A superlattice structure comprising m layers of a first one of silicon (Si) and Sb doped silicon germanium (SiGe) alternating with n layers of silicon germanium (SiGe), each of the layers having an electronic structure which provides the superlattice structure having a thermoelectric power generation characteristic and a thermoelectric figure of merit which increases with increasing temperature up to a temperature range of greater than 300° K. to about 1000° K.

31. The superlattice structure of claim 30 wherein:

said n layers of SiGe are provided having a compositional ratio of silicon to germanium in the range of 0.3 to 0.7; and m and n are between 10 and 100.

32. The superlattice of claim 30 wherein the Si layers are provided having an n-type carrier concentration greater than of about $2 \times 10^{18}$ cm$^{-3}$.

33. The superlattice structure of claim 30 wherein the silicon layers are provided having an n-type carrier concentration of about $4 \times 10^{18}$ cm$^{-3}$.

34. The superlattice of claim 30 wherein:

the m layers correspond to m layers of Sb doped $Si_{0.7}Ge_{0.3}$ the n layers correspond to n layers of Si;

m is between 10 and 100; and n is between 10 and 100.

35. The superlattice structure of claim 34 further comprising:

a substrate having an insulating characteristic;

an $Si_{0.7}Ge_{0.3}$ buffer layer disposed over said substrate; and a silicon quantum well layer disposed over said $Si_{0.7}Ge_{0.3}$ buffer layer and wherein said m Sb doped $Si_{0.7}Ge_{0.3}$ layers and n layers of Si are provided alternately using an epitaxial technique.

* * * * *

UNITED STATES PATENT AND TRADEMARK OFFICE
CERTIFICATE OF CORRECTION

PATENT NO. : 6,060,656
DATED : May 9, 2000
INVENTOR(S) : Dresselhaus et al.

Page 1 of 1

It is certified that error appears in the above-identified patent and that said Letters Patent is hereby corrected as shown below:

Title page,
Item 73, under Assignee add --Massachusetts Institute of Technology, Cambridge Mass.

Column 4,
Line 52, delete "a" and replace with --as--.

Column 7,
Line 30, delete "a series of curves 58, 60, 62, 64" and replace with --plots--.

Column 8,
Line 9, delete "$1x10^{18}$" and replace with --$1x10^{19}$--.
Line 30, delete "claim 3" and replace with --claim 2--.
Line 31, delete "quantum" and replace with --buffer--.

Signed and Sealed this

Thirty-first Day of July, 2001

*Attest:*

Nicholas P. Godici

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

| | |
|---|---|
| PATENT NO. | : 6,060,656 |
| APPLICATION NO. | : 09/039719 |
| DATED | : May 9, 2000 |
| INVENTOR(S) | : Mildred S. Dresselhaus |

It is certified that error appears in the above-identified patent and that said Letters Patent is hereby corrected as shown below:

In column one lines 8-12 under the "Government Rights" section delete the entire paragraph and replace with --This invention was made with government support under Grant No. F19628-95-C-0002 awarded by the US Air Force and Grant No. N00167-92-K-0052 awarded by the US Navy. The government has certain rights in this invention.--

Signed and Sealed this
Fourteenth Day of June, 2011

David J. Kappos
*Director of the United States Patent and Trademark Office*